(12) United States Patent
Hu et al.

(10) Patent No.: US 6,417,118 B1
(45) Date of Patent: Jul. 9, 2002

(54) METHOD FOR IMPROVING THE MOISTURE ABSORPTION OF POROUS LOW DIELECTRIC FILM

(75) Inventors: Jung-Chih Hu, Kaohsiung; Lih-Juann Chen, Hsin-Chu, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/888,583

(22) Filed: Jun. 26, 2001

(51) Int. Cl.[7] .............................................. H01L 21/469
(52) U.S. Cl. ...................... 438/790; 438/960; 438/974
(58) Field of Search ............................ 438/4, 778, 781, 438/787, 795, 960, 974, 790

(56) References Cited

U.S. PATENT DOCUMENTS 4,936,921 A * 6/1990 Berruex .......................... 134/1

* cited by examiner

Primary Examiner—Trung Dang

(57) ABSTRACT

A method for improving the moisture absorption of porous low dielectric film in an interconnect structure is disclosed. The porous low-k dielectric layer such as porous hydrosilsesquioxane (porous HSQ) or porous methyl silsesquioxane (porous MSQ) is spun-on the etching stop layer. After plasma process, the porous low dielectric film has a plurality of dangling bonds. Then, the wafer is placed in the supplementary instrument with hydrophobic reactive solution. Next, the hydrophobic protection film is formed on surface and sidewall of porous low-k dielectric film to improve the moisture absorption of porous low-k dielectric film and the leakage current is reduced in subsequently processes.

20 Claims, 4 Drawing Sheets

METHOD FOR IMPROVING THE MOISTURE ABSORPTION OF POROUS LOW DIELECTRIC FILM

BACKGROUND OF THE INVENTION

1. Field of the Invention

The present invention generally relates to a method for forming a low dielectric film in an interconnect structure and more particularly to a method for improving the moisture absorption of porous low dielectric film.

2. Description of the Prior Art

Through advanced semiconductor process in techniques, integrated circuit devices with sub-micron and sub-half-micron features sizes can now be manufactured. This trend toward deep sub-micron technology (i.e., involving feature sizes less than 0.35 microns) has, in turn, driven the need for multilevel interconnect. As a result, circuit performance in the deep sub-micron regime is increasingly a function of the delay time of electronic signals traveling between the millions of gates and transistors presented on the typical integrated circuit chip. Parasitic capacitance and resistance effects resulting from these otherwise passive interconnect structures must therefore be well controlled. Toward this end, recent researches emphasize the use of low resistance metals (e.g., copper) in conjunction with insulating material with low dielectric constant (low-k dielectrics) between metal lines. Low-k dielectric meaning that is a dielectric material, which exhibits a dielectric constant substantially less than conventional dielectric materials such as silicon dioxide, silicon nitride, and silicon oxynitride. Silicon dioxide, for example, has a dielectric constant than 4.1. Copper is desirable in that its conductivity is relatively high and it is relatively high resistance of electromigration than many metals (for example, aluminum).

On the other hand, considerable attention has been focused on the replacement of silicon dioxide with new materials, i.e. particular materials having lower dielectric constants, since both capacitive delays and power consumption depend on the dielectric constant of the insulator. Accordingly, circuit performance enhancement is need for combining the copper conductors with low dielectric constant insulators (k less than approximately 4).

Herein, low dielectric constant material means a material having a dielectric constant lower than about 3.5, preferably lower than 3 and most preferably about 2 or even lower. Unfortunately, materials with a lower dielectric constant have characteristics that make them difficult be integrated into existing integrated circuit structures and processes. Many polymeric materials such as polysilsesquioxane, parylene, polyimide, benzocyclobutene, and amorphous Teflon have lower dielectric constants (lower permittivities). On the other hand, for inorganic materials, Aerogel having porous silica structure which are typically made from a gelation of tetraethoxysilane (TEOS) stock solution. Compared to conventional $SiO_2$, these preferred low-k materials due to the nature of structure typically have low mechanical strength, poor dimensional stability, poor temperature stability, high moisture absorption, permeation, poor adhesion, large thermal expansion coefficient, and an unstable stress level. Because of these characteristics, the use of polymer or other low dielectric materials as the only replacement for $SiO_2$ in integrated circuit processes or structures is very problematic.

In the conventional technique, after plasma etching process or chemical mechanical polishing (CMP) process, the plasmas process with hydrogen gas is provided a plurality of hydrogen atoms on the surface of porous low-k dielectric film to form hydrophobic Si—H bond on surface of porous low-k dielectric film. However, the plasma process is also used to etch the porous low-k dielectric film to bring about the plasma damage of porous low-k dielectric film.

Furthermore, there is a solution chemical reaction method to replace the prior art technique to form hydrophobic protection film and the plasma damage of porous low-k dielectric film will not be created.

SUMMARY OF THE INVENTION

It is an object of this invention is to provide a hydrophobic film to improve the absorption moisture of porous low-k dielectric film after plasma etching process or chemical mechanical polishing process.

It is another object of this invention is to maintain the dielectric constant of porous low-k dielectric film and the leakage current is reduced.

It is still another object of this invention is to provide a low temperature, a simple manufacture process and the low cost for fabrication.

In this invention, after plasma process or chemical mechanical polishing process, the wafer is placed in the supplementary instrument such as ultrasonic vibration apparatus or reflux apparatus with reactive solution such as dihydrosiloxane reagent ($H_2Si(OH)_2$ or $H_2Si(OR)_2$) or organosiloxane reagent ($H_2Si(OH)_2$ or $H_2Si(OR)_2$, wherein R is alkyl group, R=$CH_3$, $C_2H_5$, $C_3H_7$) with concentration about 10 wt % to 20 wt %, and a dilute inorganic acid solution such as $H_2SO_4$ (sulfuric acid), HCl (hydrochloric acid), or $HNO_3$ (nitric acid) is serve as catalyst in this invention. After five to ten minutes, the reaction is completely, the hydrophobic protection film (Si—O—$SiR_2$) is formed on surface and sidewall of porous low-k dielectric film to improve the moisture absorption of porous low-k dielectric film and the leakage current is reduced in subsequently processes.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

In this invention, firstly, the porous low-k dielectric film is spun-on the semiconductor substrate. Then, a photolithography process is performed on the porous low-k dielectric layer and then porous low-k dielectric film is etched by plasma etching such as reactive ion etching method to form a via hole above the semiconductor substrate. Herein, the porous dielectric film has a plurality of dangling bond, whose characteristic is hydrophilic. Then, the wafer is placed on an ultrasonic vibration apparatus with reactive solution After five to ten minutes, the chemical reaction is completely, the Si—OH group of the porous low-k dielectric film of the wafer is reacted with reactive solution to form a hydrophobic protection film on the porous low-k dielectric film. Wherein the hydrophobic protection film has a plurality of leaving group (Si—O—Si(CH$_3$)$_2$.). Then, the wafer is rinsed by deionization water and the wafer is dried by nitrogen (N$_2$) gas. Next, in order to remove the moisture of wafer is completely, the wafer is placed in chamber with nitrogen gas and the wafer is baked with temperature about 100° C. to 200° C. and the time about 60 minutes such that the leaving group is to be removed.

Next, a metal barrier layer is formed on the sidewall of the via hole. Then, a metal layer is deposited to fill up the via hole. Thereafter, a planarization process is performed on the metal layer to form a metal plug in the via hole, wherein the metal plug is used to connect different level of interconnect structure.

Figure 1:
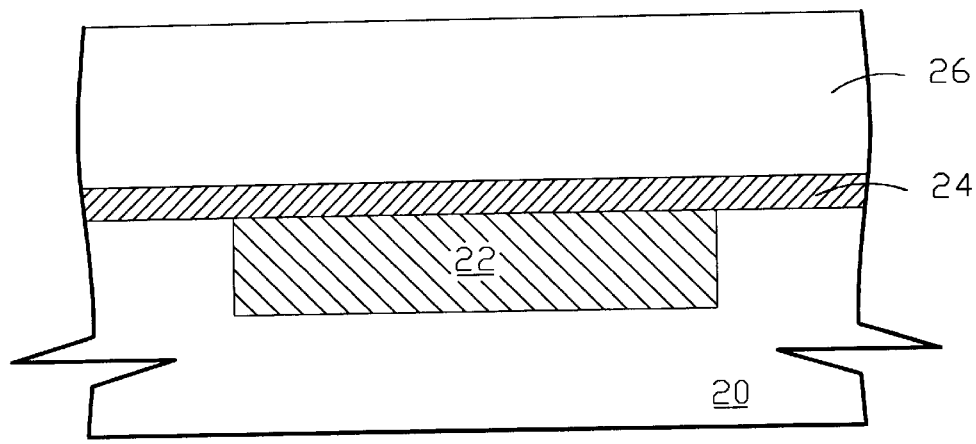
FIG. 1 is a cross-sectional view showing an etching stop layer and a low-k dielectric film on substrate in accordance with a method disclosed herein.

Referring to FIG. 1, a semiconductor substrate 20 having a conductive region 22 and an etching stop layer 24 such as silicon nitride layer is formed by conventional chemical vapor deposition method on a semiconductor substrate 20.

The RC delay (resistance capacitance delay) increases because the capacitance between the more tightly packed metal lines increase (small pitch) and the resistance of the smaller pitch lines is large. To address the interconnect RC delay problem, new material for metal conductors and interlayer dielectrics (ILDs) and alternative integration architectures have surfaced to replace the current interconnect technology that is based on Al (Cu) conductors insulated by plasma deposited SiO$_2$ (dielectric constant >>4.1) with metal plugs in the via that connect the different wiring levels. These alternative architectures will require the introduction of low dielectric constant (k) materials as the interlayer dielectric and/or low resistivity conductors such as copper (Cu). Low-k materials reduce the capacitance between the lines and thus reduce the RC delay, cross talk, and power dissipation.

Figure 2:
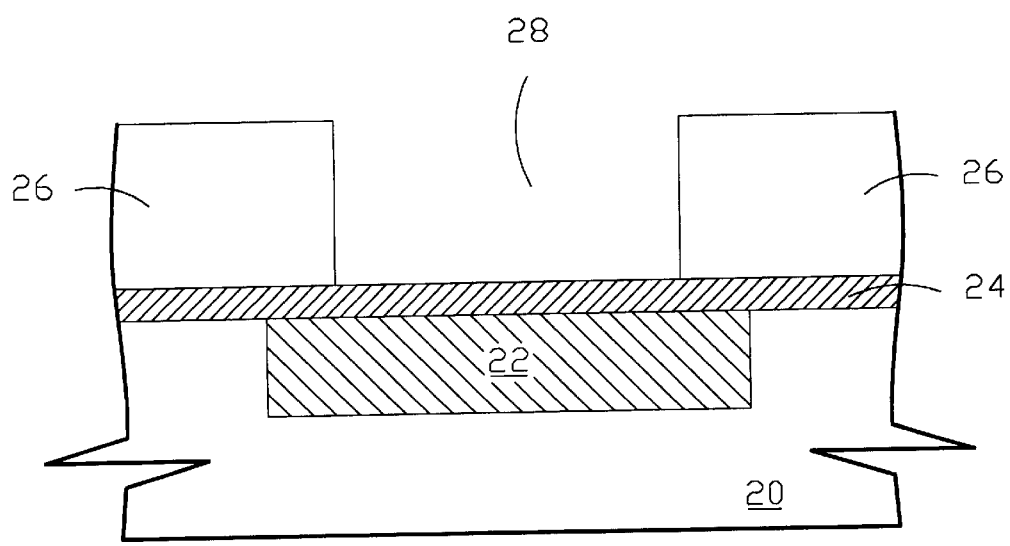
FIG. 2 is a cross-sectional view showing a via hole above the etching stop layer in accordance with a method disclosed herein.

Referring to FIG. 2, a low-k dielectric film 26 is formed on etching stop layer 24. The characteristic of low-k dielectric layer is changed hydrophobic from hydrophilic in this invention. The moisture absorption is a problem for the porous low-k dielectric layer even though the porous low-k dielectric layer is widely used in the semiconductor fabrication. In this embodiment, the porous low-k dielectric film 26 such as porous HSQ (porous hydrosilsesquioxane) is formed on etching stop layer 24. The value of porous HSQ with dielectric constant (k) is smaller than about 2. In another alternative embodiment, the material of porous low-k dielectric film 26 is porous methyl silsesquioxane (porous MSQ) with value of dielectric constant is also smaller then about 2. Then, a photoresist layer is deposited, exposed, and developed on the low-k dielectric film 26 by the use of know photolithography techniques. Then, an etching step such as RIE (reactive ion etching) method is performed on porous low-k dielectric film 26 to remove the exposed portion of the porous low-k dielectric film 26 to form a via hole 28, wherein the via hole 28 is above the etching stop layer 24.

After porous low-k dielectric film 26 is etched, the surface and the sidewall of porous low-k dielectric film 26 have a plurality of dangling bond (Si—OH), whose characteristics exhibits hydrophilic. The plurality of the dangling bond will be caused the moisture absorption problem, when the wafer is exposed in the air or in subsequently process. To solve this problem, in accordance with this invention is provided a method to improve the moisture absorption of porous low-k dielectric film 26.

The wafer is placed in the supplementary instrument such as ultrasonic vibration apparatus or reflux apparatus with reactive solution such as dihydrosiloxane reagent with concentration about 10 wt % to 20 wt %, and a dilute inorganic acid solution such as H$_2$SO$_4$ (sulfuric acid), HCl (hydrochloric acid), or HNO$_3$ (nitric acid) is serve as catalyst in this invention. The catalyst is used to enhance the reaction rate.

In one embodiment, the reactive solution is dihydrosiloxane reagent. The formula of dihydrosiloxane is H$_2$Si(OH)$_2$ or H$_2$Si(OR)$_2$ which exhibits the hydrophobic characteristics, wherein the R is a straight chain alkyl group such as methyl group (CH$_3$), ethyl group (C$_2$H$_5$), propyl group (C$_3$H$_7$) and so on. The dihydrosiloxane reagent is used to react with hydrophilic function group such as Si—OH for porous silsesquioxane to form the leaving group Si—O—SiH$_2$ whose characteristic is hydrophobic. The dihydrosiloxane reagent is formed from dihydrosiloxane dichloride (H$_2$SiCl$_2$) reacted with water (H$_2$O). The reaction is as follow:

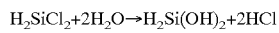

Another formation of dihydrosiloxane reagent is reacted with anhydrous alcohol (ROH), wherein the R is a straight chain alkyl group for example, methyl group (CH$_3$), ethyl group (C$_2$H$_5$), or propyl group (C$_3$H$_7$). The reaction is as follow:

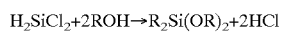

Figure 3:
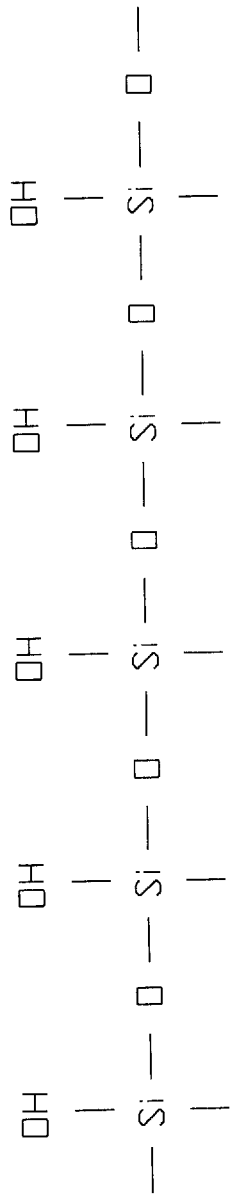
FIG. 3 is a schematic representation of the formation of a plurality of dangling bonds (Si—OH) of porous low-k dielectric film after plasma etching process in accordance with a method disclosed herein.
Figure 4:
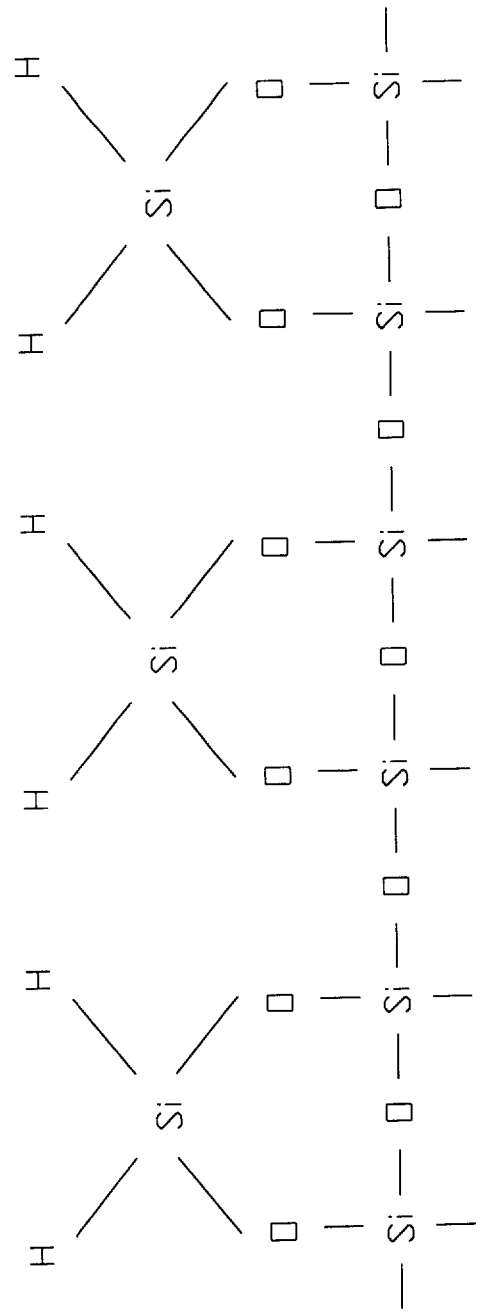
FIG. 4 is a schematic representation of the formation of a plurality of hydrophobic protection film (Si—O—$SiH_2$) of porous low-k dielectric film after reaction with reactive solution in accordance with a method disclosed herein.
Figure 5:
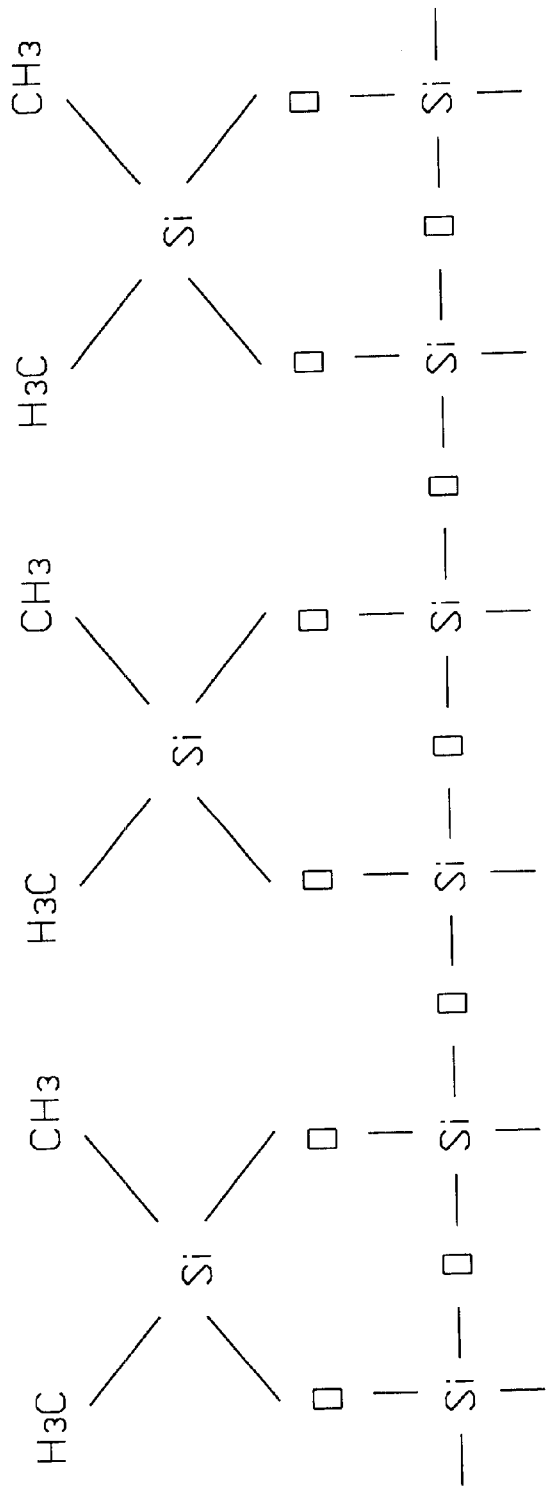
FIG. 5 is a schematic representation of the formation of a plurality of hydrophobic protection film (Si—O—$Si(CH_3)_2$) of porous low-k dielectric film after reaction with reactive solution in accordance with a method disclosed herein.

Referring to FIG. 3 to FIG. 5, after five to ten minutes, a plurality of Si—OH bonds (moisture absorption bonds) of dihydrosiloxane reagent is reacted to form a hydrophobic protection film, which has a plurality of Si—O—SiH$_2$ bonds (hydrophobic group)(shown in FIG. 3). Herein, the characteristic of Si—O—SiH$_2$ is more hydrophobic than Si—OH bonds (Shown in FIG. 4). In order to confirm the chemical reaction is completely, the wafer is analyzed by the FT-IR (Fourier Transform infrared spectroscopy). Before reacted with reactive solution or reaction is not completely, there is no explicit absorption peak to Si—H bond, and then after five to ten minutes, and for Si—H bond, there is a strong absorption peak at the wave number of about 2200 cm$^{-1}$ to 2250 cm$^{-1}$. Therefore, hydrophobic film is formed on sidewall and surface of the porous low-k dielectric layer to solve the problem of moisture absorption and the leakage current is to be improved.

In another embodiment, the reactive solution is organosiloxane reagent. The chemical formula of organosiloxane reagent is $R_2Si(OH)_2$ or $R_2Si(OR')_2$, wherein the R and R' is a straight chain alkyl group for example, methyl group ($CH_3$), ethyl group ($C_2H_5$), or propyl group ($C_3H_7$). The formation of organosiloxane reagent ($R_2Si(OH)_2$) is tetrachlorosilane ($SiCl_4$) reacted with Grignard reagents such as RMgCl in anhydrous condition to form $R_2SiCl_2$, wherein the R is alky group. The reaction is as follow:

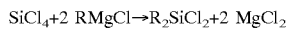

When the water is added into above reaction, the organosiloxane reagent ($R_2Si(OH)_2$) is formed. The reaction is as follow:

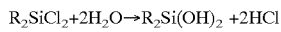

Another formation of organosiloxane reagent $R_2Si(OR')_2$ is reacted with anhydrous alcohol (ROH), wherein the R is a straight chain alkyl group for example, methyl group ($CH_3$), ethyl group ($C_2H_5$), or propyl group ($C_3H_7$). The reaction is as follow:

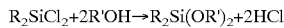

The organosiloxane reagent with concentration about 10 wt % to 20 wt % is placed in ultrasonic vibration apparatus with catalyst. After five to ten minutes, a plurality of Si—OH bonds of dihydrosiloxane reagent is reacted to form a hydrophobic protection film has a plurality of Si—O—SiCH$_3$ (shown in FIG. 5). In the same way, in order to confirm the chemical reaction is completely, the wafer is analyzed by the FT-IR (Fourier Transform infrared spectroscopy). Before reacted with reactive reagent or reaction is not completely, there is no explicit absorption peak to C—H bond and Si—C bond. After five to ten minutes, there appears strong absorption peak corresponding to the C—H bond at the wave number of about 3000 cm$^{-1}$ and Si—C bond at the wave number of about 500 cm$^{-1}$ t0 1000 cm$^{-1}$ and 1000 cm$^{-1}$ to 1500 cm$^{-1}$. Herein, the characteristic of Si—O—SiCH$_3$ is more hydrophobic than Si—OH bonds. Therefore, hydrophobic film is formed on sidewall and surface of the low-k dielectric film to solve the problem of moisture absorption and the leakage current is to be improved.

Then, the wafer is rinsed out by deionization water and purged by nitrogen gas. Next, the wafer is placed in the chamber with nitrogen gas and baked at temperature 100° C. to 200° C. and time is about 1 to 30 minutes. And the by-products such as water ($H_2O$) or alcohol (R—OH, R=$CH_3$, $C_2H_5$, $C_3H_7$) is removed by baking process at temperature about 100° C. to 200° C. and time is about 30 minutes.

Figure 6:
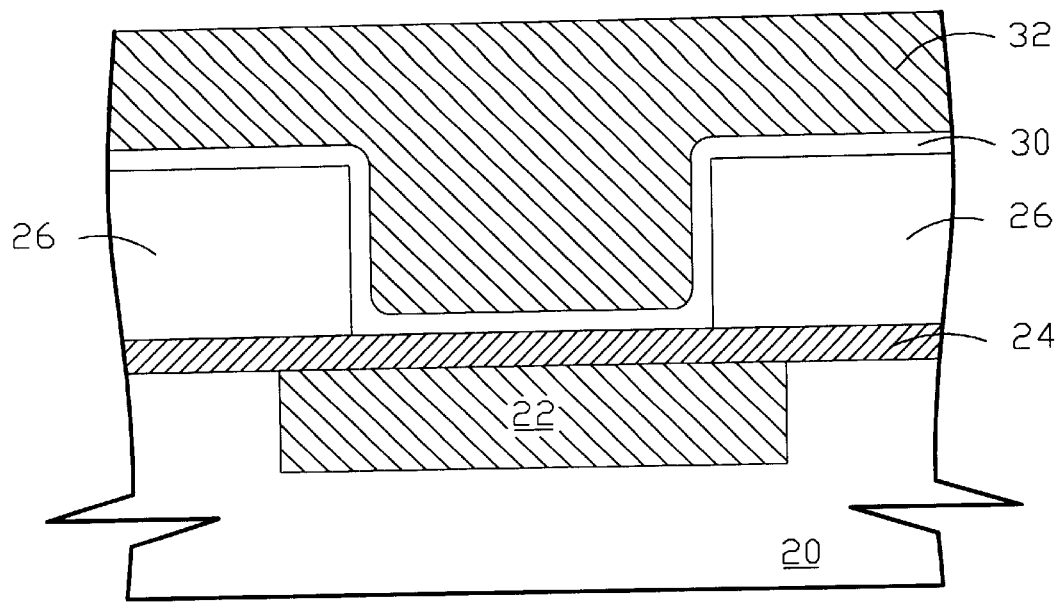
FIG. 6 is a cross-sectional view showing a metal layer on the via hole in accordance with a method disclosed herein.
Figure 7:
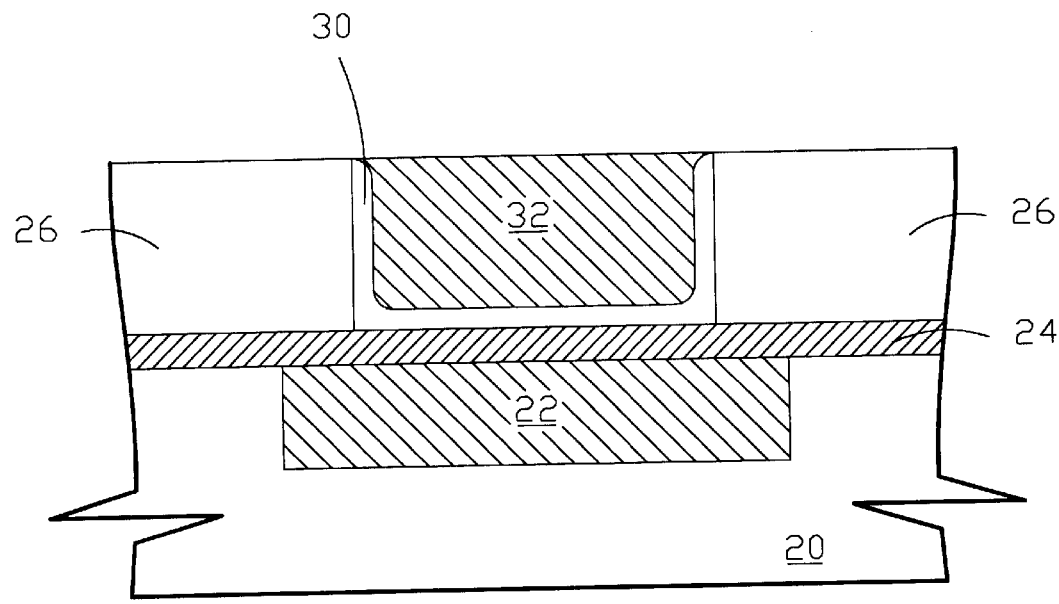
FIG. 7 is a cross-sectional view showing an interconnect structure formed on the substrate in accordance with a method disclosed herein.

Then, referring to FIG. 6 and FIG. 7, a metal barrier 30 such as TaN (tantalum nitride) is deposited on the sidewall of the via hole 28 by sputtering method. Then, the metal layer 32 is deposited to fill the via hole 28. The material of metal layer 32 can be Al (aluminum) or Cu (copper). Next, referring to FIG. 7, a metal plug 32 is formed by chemical mechanical polishing (CMP) method to polish away excess metal layer 32 on the low-k dielectric layer 26.

According to above-mentioned description, after plasma etching or CMP process, the dangling bond of porous low-k dielectric film is reacted with reactive solution to form hydrophobic group. And then, hydrophobic protection film has a plurality of Si—O—SiH$_2$ or Si—O—SiCH$_3$ group on the surface and sidewall of porous low-k dielectric film such that the moisture absorption for porous low-k dielectric film can be reduced. Due to the plasma process will be damaged the porous low-k dielectric film in subsequently process, for this reason, this invention compares effective with the prior art that is using hydrogen plasma performed on the surface of wafer to form a plurality of hydrophobic Si—H bonds. Another advantages for this invention is that the process is simple, low process temperature, and the cost is lower than the prior art.

Although specific embodiments have been illustrated and described, it will be obvious to those skilled in the art that various modifications may be made without departing from what is intended to be limited solely by the appended claims.

What is claimed is:

1. A method for improving the moisture absorption of dielectric film, said method comprising:

providing a dielectric film having a via hole on a semiconductor substrate, wherein said dielectric film has a plurality of dangling bond and characteristic of said dangling bond is hydrophilic; and treating said dielectric film with a siloxane solution and an ultrasonic vibration apparatus such that the characteristic of said dielectric film is changed hydrophobic from hydrophilic.

2. The method according to claim 1, wherein material of said dielectric film comprises porous methyl silsesquioxane (porous MSQ).

3. The method according to claim 1, wherein material of said dielectric film comprises porous hydrosilsesquioxane (porous HSQ).

4. The method according to claim 1, wherein the chemical formula of said siloxane solution comprises hydrogen atom.

5. The method according to claim 1, wherein the chemical formula of said siloxane solution comprises a straight chain alkyl group.

6. The method according to claim 1, further comprising a catalyst in said ultrasonic vibration apparatus.

7. The method according to claim 1, further comprising a purging process is performed on said dielectric film by nitrogen gas.

8. The method according to claim 1, further comprising a baking process is performed on said dielectric film in a nitrogen furnace.

9. A method for improving the moisture absorption of the low dielectric film, said method comprising:

placing a low dielectric film in an ultrasonic vibration apparatus, and a siloxane solution and a catalyst therein, wherein said low dielectric layer has a plurality of dangling bonds and the characteristic of said dangling bonds is hydrophilic;

treating said low dielectric film such that said characteristic of said dangling bonds is changed hydrophobic from hydrophilic;

rinsing said low dielectric film such that said siloxane solution remained on said low dielectric film is to be cleaned;

purging said low dielectric film; and backing said low dielectric film.

10. The method according to claim 9, wherein said low dielectric film comprises porous methyl silsesquioxane (porous MSQ).

11. The method according to claim 9, wherein said low dielectric film comprises porous hydrosilsesquioxane (porous HSQ).

12. The method according to claim 9, wherein the chemical formula of said siloxane solution comprises hydrogen atom.

13. The method according to claim 9, wherein the chemical formula of said siloxane solution comprises a straight chain alkyl group.

14. A method for improving the moisture absorption of the porous low dielectric film, said method comprising:

placing a porous low dielectric film in an ultrasonic vibration apparatus and a siloxane solution therein, wherein said porous low dielectric film has a plurality of dangling bonds and the characteristic of said dangling bonds is hydrophilic;

treating said porous low dielectric film such that said characteristic of said dangling bonds is changed hydrophobic from hydrophilic;

rinsing said porous low dielectric film by deionization water such that said siloxane solution remained on said porous low dielectric film is to be cleaned;

purging said porous low dielectric film by nitrogen gas; and backing said porous low dielectric film in a nitrogen furance.

15. The method according to claim 14, wherein said porous low dielectric film comprises porous methyl silsesquioxane (porous MSQ).

16. The method according to claim 14, wherein said porous low dielectric film comprises porous hydrosilsesquioxane (porous HSQ).

17. The method according to claim 14, wherein the chemical formula of said siloxane solution comprises hydrogen atom.

18. The method according to claim 14, wherein the chemical formula of said siloxane solution comprises a straight chain alkyl group.

19. The method according to claim 14, further comprising a catalyst in said ultrasonic vibration apparatus such that the reaction rate of said dangling bond from hydrophilic to hydrophobic is increased.

20. The method according to claim 19, wherein said catalyst is selected from the group consisting of a sulfuric acid solution, a hydrochloric acid solution, and a nitric acid solution.

* * * * *